United States Patent
Wakita

(10) Patent No.: US 8,013,331 B2
(45) Date of Patent: Sep. 6, 2011

(54) THIN FILM TRANSISTOR, METHOD OF MANUFACTURING THE SAME, AND ELECTRONIC DEVICE USING THE SAME

(75) Inventor: Naohide Wakita, Osaka (JP)

(73) Assignee: Panasonic Corporation, Osaka (JP)

( * ) Notice: Subject to any disclaimer, the term of this patent is extended or adjusted under 35 U.S.C. 154(b) by 230 days.

(21) Appl. No.: 12/305,101

(22) PCT Filed: Jun. 14, 2007

(86) PCT No.: PCT/JP2007/062026
§ 371 (c)(1),
(2), (4) Date: Dec. 16, 2008

(87) PCT Pub. No.: WO2007/148601
PCT Pub. Date: Dec. 27, 2007

(65) Prior Publication Data
US 2009/0224239 A1 Sep. 10, 2009

(30) Foreign Application Priority Data

Jun. 19, 2006 (JP) ................................ 2006-168318

(51) Int. Cl.
*H01L 29/26* (2006.01)
*H01L 29/786* (2006.01)
(52) U.S. Cl. ........... 257/43; 257/E29.079; 257/E21.411; 438/104
(58) Field of Classification Search .................... 257/43, 257/66, 72, E29.273, E29.079, E21.411; 438/104, 500, 584
See application file for complete search history.

(56) References Cited

U.S. PATENT DOCUMENTS

| | | | |
|---|---|---|---|
| 7,378,711 B2 | 5/2008 | Suh et al. | |
| 2005/0039670 A1 | 2/2005 | Hosono et al. | |

FOREIGN PATENT DOCUMENTS

| | | |
|---|---|---|
| JP | 2004-103957 A | 4/2004 |
| JP | 2004-349583 A | 12/2004 |
| JP | 2005-244240 A | 9/2005 |
| JP | 2007-042690 A | 2/2007 |
| WO | WO 20007/017689 A2 | 2/2007 |

OTHER PUBLICATIONS

Volkman, S. K. "A novel transparent air-stable printable n-type semiconductor technology using ZnO nanoparticles", Electron Devices Meeting, IEDM Technical Digest, IEEE International, Dec. 13-15, 2004, pp. 769-772. Nomura, K. et al. "Room-temperature fabrication of transparent flexible thin-film transistors using amorphous exide semiconductors", Nature, vol. 432, Nov. 25, 2004, pp. 488-492.
Nomura, K. et al. "Electron transport in InGaO$_3$(ZnO)$m$ ($m$=integer) studied using single-crystalline thin films and transparent MISFETs", Thin Solid Films, vol. 445, 2003, pp. 322-326.

*Primary Examiner* — Thomas L Dickey
*Assistant Examiner* — Fazli Erdem
(74) *Attorney, Agent, or Firm* — Hamre, Schumann, Mueller & Larson, P.C.

(57) ABSTRACT

A thin film transistor according to the present invention includes: a semiconductor layer (5); a source electrode (3*s*) and a drain electrode (3*d*) that each are connected to the semiconductor layer (5); an insulating layer (6) that is formed adjacent to the semiconductor layer (5); and a gate electrode (7) that faces the semiconductor layer (5) across the insulating layer (6). The semiconductor layer (5) includes an aggregate of semiconductor fine particles composed of a complex oxide. The complex oxide contains zinc and at least one selected from a group consisting of indium, gallium and rhodium.

13 Claims, 4 Drawing Sheets

THIN FILM TRANSISTOR, METHOD OF MANUFACTURING THE SAME, AND ELECTRONIC DEVICE USING THE SAME

TECHNICAL FIELD

The present invention relates to a thin film transistor, a method of manufacturing the same, and an electronic device using the same.

BACKGROUND ART

Thin film transistors (TFTs) using amorphous silicon or polysilicon have been put to practical use as drive elements for liquid crystal displays. Generally, these TFTs are formed in a manufacturing process in which various methods such as CVD, sputtering and photolithography are used in combination. Vacuum film-forming apparatuses used for the CVD and sputtering methods and photolithography apparatuses are both expensive, and thus the cost of these apparatuses accounts for a significant part of the manufacturing cost of liquid crystal panels. In addition, amorphous silicon films and polysilicon films are fabricated at high temperatures, and therefore substrates having low heat resistance, such as a plastic substrate, cannot be used for such films.

As a method of forming a TFT on a plastic substrate, for example, a method of forming a semiconductor layer using semiconductor nanomaterials such as Si nanowires and ZnO nanorods has been proposed (JP 2005-244240 A).

As another example, a method of forming an n-type semiconductor film having a mobility of approximately 0.1 $cm^2/V \cdot s$ by using ZnO fine particles modified with organic molecules has been proposed (Electron Devices Meeting, 2004, IEDM Technical Digest. IEEE International, 13-15 Dec. 2004, pages 769-772, "A novel transparent air-stable printable n-type semiconductor technology using ZnO nanoparticles"). In this method, baking is carried out after the ZnO fine particles are applied, and the baked surface further is subjected to hydrogenation.

A TFT using an amorphous $InGaO_3 \cdot ZnO$ semiconductor film also has been disclosed (Nature, Vol. 432, pages 488-492, November 2004, "Room-temperature fabrication of transparent flexible thin-film transistors using amorphous oxide semiconductors"). The amorphous $InGaO_3 \cdot ZnO$ semiconductor film is formed at room temperature by a pulse laser ablation method, which is one of the vacuum film-forming methods. The amorphous film that is formed by adding indium and gallium into zinc oxide has a higher mobility than that of an amorphous silicon film. Furthermore, single crystalline $InGaO_3(ZnO)_m$ complex oxide has been fabricated by a unique technique (Reactive Solid Phase Epitaxy) in which ZnO and $InGaO_3$ thin films formed by pulse laser ablation are covered with an oxide substrate and are subjected to annealing at 1400° C. in a sealed condition (Thin Solid Films, Vol. 445, pages 322-326, 2003, "Electron transport in $InGaO_3$ $(ZnO)_m$ (m is an integer) studied using single-crystalline thin films and transparent MISFETs").

Semiconductor nanomaterials such as semiconductor nanowires and semiconductor nanorods alone have high mobility. However, these semiconductor nanomaterials are strongly anisotropic in their properties. Therefore, in order to form a semiconductor film having high mobility by using such semiconductor nanomaterials, they need to be oriented in a specific direction. However, it is not easy, in the state of the art, to orient the nanomaterials.

On the other hand, it is possible to fabricate semiconductor films using ZnO fine particles or CdSe fine particles by an easy process. However, these semiconductor films have lower mobilities than that of an amorphous silicon film, which is not satisfactory in their performance to drive liquid crystal elements and organic EL elements.

Semiconductor films using semiconductor nanomaterials or semiconductor fine particles have an advantage that they can be formed at low cost because they can be formed without a vacuum film-forming apparatus. These semiconductor films have another advantage that they can be formed by a low-temperature process. Therefore, TFTs using semiconductor nanomaterials or semiconductor fine particles have been studied for more than 10 years as promising TFTs. However, these TFTs have not yet achieved successfully both the ease of the manufacturing process and the satisfactory performance, and thus have not yet been put to practical use.

DISCLOSURE OF INVENTION

Under these circumstances, an object of the present invention is to provide a high-performance thin film transistor that is easy to manufacture. Another object of the present invention is to provide a method of manufacturing the thin film transistor and an electronic device using the thin film transistor.

In order to achieve the above objects, one aspect of the present invention is a thin film transistor including: a semiconductor layer; a source electrode and a drain electrode that each are connected to the semiconductor layer; an insulating layer that is formed adjacent to the semiconductor layer; and a gate electrode that faces the semiconductor layer across the insulating layer. In this thin film transistor, the semiconductor layer includes an aggregate of semiconductor fine particles composed of a complex oxide, and the complex oxide contains zinc and at least one selected from a group consisting of indium, gallium, and rhodium.

Another aspect of the present invention is a method of manufacturing a thin film transistor including a semiconductor layer, and the method includes the steps of (i) forming a layer including an aggregate of semiconductor fine particles composed of a complex oxide by using a liquid that contains the semiconductor fine particles composed of the complex oxide; and (ii) forming the semiconductor layer by subjecting the layer including the aggregate of the semiconductor fine particles to a heat treatment at a temperature of 150° C. or higher. In this manufacturing method, the complex oxide contains zinc and at least one selected from a group consisting of indium, gallium, and rhodium.

Still another aspect of the present invention is an electronic device including an electronic circuit, and the electronic circuit includes the thin film transistor according to the present invention.

The present invention makes it possible to realize a high-performance thin film transistor at low cost by an easy process. The present invention also makes it possible to carry out the process at lower temperatures, and therefore to form a thin film transistor on a substrate made of resin.

BEST MODE FOR CARRYING OUT THE INVENTION

Figure 1:
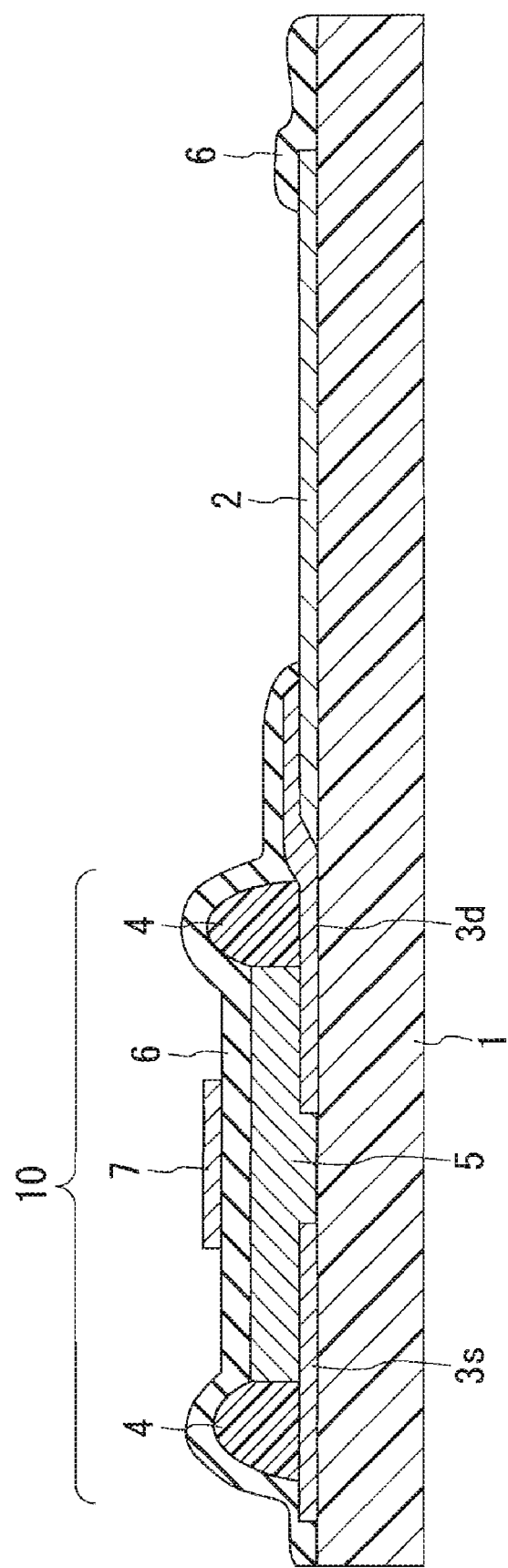
FIG. 1 shows a cross section of an example of a thin film transistor according to the present invention.

Embodiments of the present invention will be described below. It should be noted that the present invention is not limited to the following description of embodiments and examples. In the following description, a specific numerical value or a specific material may be illustrated as an example. However, other numerical values or other materials may be applied as long as the advantageous effects of the present invention can be attained.

[Thin Film Transistor (Field-Effect Transistor)]

The thin film transistor (TFT) of the present invention includes: a semiconductor layer; a source electrode and a drain electrode that each are connected to the semiconductor layer; an insulating layer that is formed adjacent to the semiconductor layer; and a gate electrode that faces the semiconductor layer across the insulating layer. The semiconductor layer includes an aggregate of semiconductor fine particles composed of a complex oxide. The complex oxide contains zinc and at least one selected from a group consisting of indium, gallium, and rhodium. Specifically, the complex oxide includes a zinc oxide and an oxide of at least one selected from a group consisting of indium, gallium, and rhodium. Hereinafter, semiconductor fine particles composed of this complex oxide also are referred to as "semiconductor fine particles (A)".

The constituent elements other than the semiconductor layer are not particularly limited, and structures and materials of known TFTs may be employed therefor.

The semiconductor layer may be composed of semiconductor fine particles (A) only. However, the semiconductor layer may contain materials other than the semiconductor fine particles (A) as long as the advantageous effects of the present invention can be obtained. The semiconductor layer commonly contains at least 50 wt % of complex oxide (at least 90 wt %, for example).

The composition of the complex oxide may be represented by $InGaO_3(ZnO)_m$ (m is a natural number of 10 or less), or $ZnO \cdot Rh_2O_3$. The use of these complex oxides makes it possible to realize a semiconductor layer having a high mobility.

It is preferable that the semiconductor fine particles (A) each are composed of a crystal of the complex oxide. For example, the semiconductor fine particles (A) each may be composed of a single crystal, a polycrystal, or a microcrystallite.

The average particle diameter of the semiconductor fine particles (A) may be not greater than 50 nm. The semiconductor fine particles (A) having an average particle diameter of not greater than 50 nm can prevent the conductivity from decreasing. The average particle diameter of the semiconductor fine particles (A) may be in the range of 1 to 20 nm. Herein, the average particle diameter is measured in the following manner. First, at least ten particles are selected arbitrarily based on the image of the cross section of the semiconductor layer taken with a transmission electron microscope. The maximum diameter and the minimum diameter of each of these particles are measured. The mean value of the maximum and minimum diameters of each particle is calculated as an average diameter, and the average value of the average diameters of all the particles is taken as an average particle diameter.

An organic substance (a surfactant, for example) may be adsorbed on the surface of the semiconductor fine particles (A). The surface of the semiconductor fine particles (A) may be terminated with hydrogen.

[Manufacturing Method of TFT]

A method of manufacturing a TFT of the present invention includes the following steps (i) and (ii). According to this manufacturing method, the TFT of the present invention can be manufactured. The structure and materials of the TFT manufactured by the manufacturing method of the present invention are the same as those of the above-mentioned TFT of the present invention, and therefore no further description may be given.

In the step (i), a layer including an aggregate of semiconductor fine particles (A) composed of a complex oxide is formed by using a liquid that contains the semiconductor fine particles (A). The liquid that contains the semiconductor fine particles (A) further may contain a surfactant. The surfactant can prevent the aggregation of the semiconductor fine particles (A). The liquid that contains the semiconductor fine particles (A) is applied onto a predetermined member and dried. There is no particular limitation on the dispersion medium which constitutes the liquid. The dispersion medium may be ethanol.

The member on which the liquid is to be applied depends on the structure of a TFT to be obtained. For example, in order to obtain a TFT in which a gate electrode, a gate insulating layer and a semiconductor layer are stacked in this order on a substrate, the liquid is applied at least onto the gate insulating layer. In order to obtain a TFT in which a semiconductor layer, a gate insulating layer and a gate electrode are stacked in this order on a substrate, the liquid is applied at least onto the substrate.

The applied liquid is dried to remove a liquid medium. The method of drying the liquid is not limited, and natural drying, vacuum drying, or heat drying may be employed. When heat drying is employed, the liquid normally is heated at approximately the same temperature as or a lower temperature than that of the heat treatment to be carried out in the subsequent step (ii).

In the step (ii), the layer that has been formed in the step (i) is subjected to heat treatment at 150° C. or higher. The semiconductor layer of the TFT is formed by this heat treatment (baking). The heat treatment may be carried out at 200° C. or higher. It is preferable that the temperature of the heat treatment is equal to or lower than the heat resistance temperature of the substrate.

There is no limitation on the method of forming the constituent elements other than the semiconductor layer. They may be formed by known methods. The source electrode, the drain electrode, the insulating layer (gate insulating layer), and the gate electrode each may be formed before the semiconductor layer is formed, or may be formed after the semiconductor layer is formed.

[Electronic Device]

The electronic device of the present invention includes an electronic circuit. The electronic circuit includes the TFT of the present invention.

The electronic device of the present invention may be a display device. For example, the display device of the present invention may include a substrate, the TFT of the present invention that is disposed on the substrate, and a light modulation layer that is driven by the TFT. A light-emitting type or light-receiving type light modulation layer can be used as the light modulation layer. Examples of the light-emitting type light modulation layer include an organic semiconductor layer to be used for an organic EL element. Examples of the light-receiving type light modulation layer include a liquid crystal.

The electronic device of the present invention may be a mobile terminal.

Hereinafter, embodiments of the present invention will be described with reference to the accompanying drawings.

First Embodiment

Figure 2:
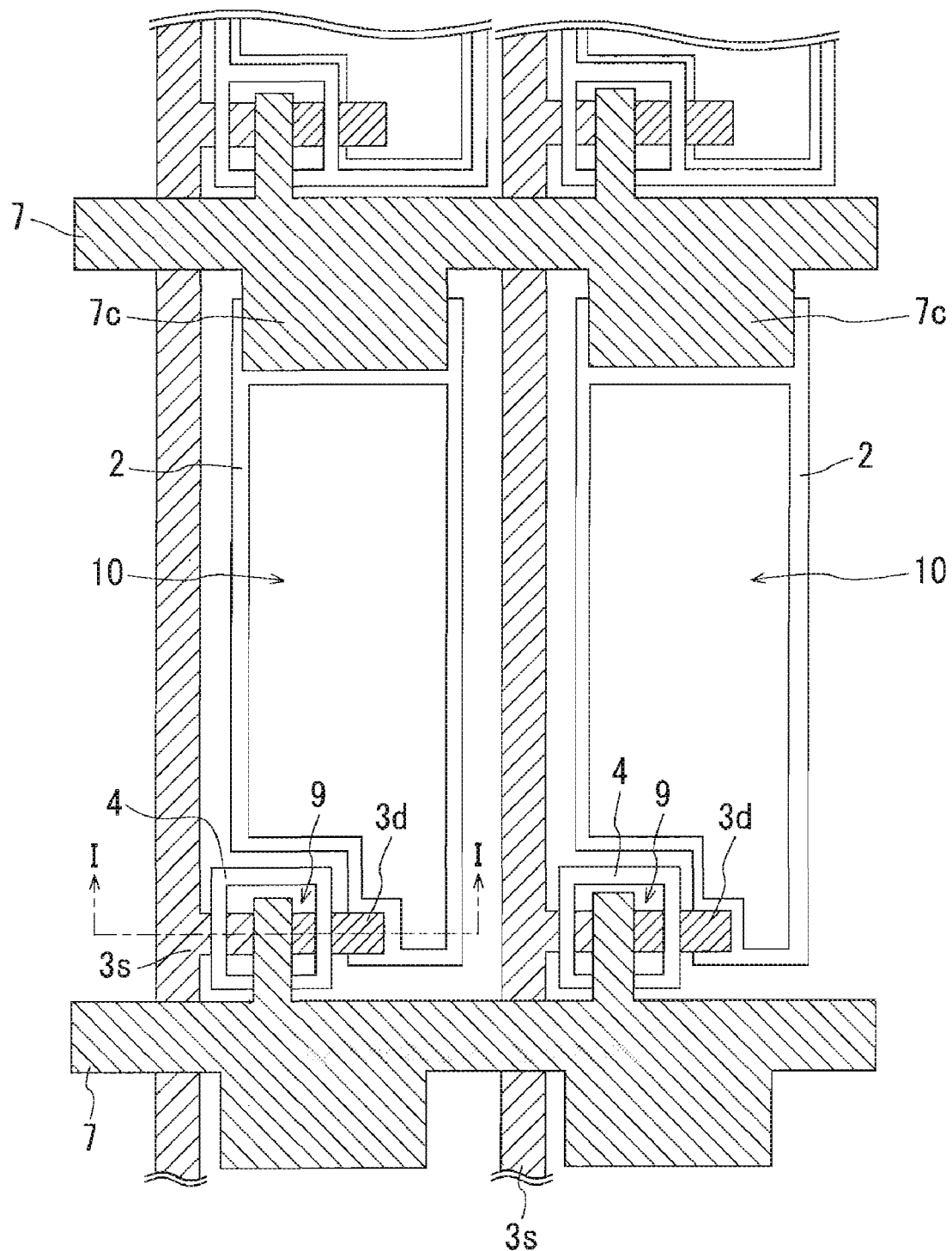
FIG. 2 is a partial plan view of the thin film transistor shown in FIG. 1.

In the first embodiment, an example of the TFT of the present invention that is formed on a substrate of a liquid crystal panel is described. FIG. 1 shows a cross-sectional view of a TFT 10 according to the first embodiment, and FIG. 2 shows a plan view thereof. FIG. 1 is a cross section of the TFT 10 viewed along the line I-I of FIG. 2. For ease of understanding, FIG. 2 does not show the semiconductor layer 5 and the insulating layer 6. In FIG. 2, the gate electrode, the source electrode and the drain electrode are hatched.

The TFT 10 is formed on a substrate 1. The TFT 10 includes a source electrode 3s, a drain electrode 3d, a semiconductor layer 5, an insulating layer 6, and a gate electrode 7.

The source electrode 3s and the drain electrode 3d are disposed on the substrate 1 at a distance from each other. The semiconductor layer 5 is formed on the substrate 1, the source electrode 3s and the drain electrode 3d. The semiconductor layer 5 is formed inside a bank 4. The insulating layer 6 is formed on the semiconductor layer 5. The gate electrode 7 is formed on the insulating layer 6. The gate electrode 7 faces the semiconductor layer 5 across the insulating layer 6. The drain electrode 3d is connected to a pixel electrode 2. The source electrode 3s and the drain electrode 3d each are connected electrically to the semiconductor layer 5.

An example of the manufacturing method of the TFT 10 is described below. First, a plastic substrate 1 made of polyether sulfone (PES) is prepared. A transparent conductive ITO film (thickness: 130 nm) is formed on the substrate 1 at a temperature of 180° C. by a sputtering method. Next, the ITO film is patterned by photolithography and etching so as to form the pixel electrode 2.

Next, a metal film having a multilayer structure in which a titanium layer (thickness: 50 nm), an aluminum layer (thickness: 200 nm) and a titanium layer (thickness: 50 nm) are stacked in this order is formed at room temperature by a sputtering method. This metal film is patterned by etching so as to form the source electrode 3s and the drain electrode 3d. The source electrode 3s extends to the edge of the substrate 1 and is connected to a drive circuit (not shown here). A part of the drain electrode 3d overlaps the pixel electrode 2.

Next, the bank 4 of 2 μm high and 5 μm wide is formed as shown in the plan view of FIG. 2. The bank 4 is formed by applying polyimide resin with an ink jet printing apparatus. As shown in FIG. 2, the bank 4 is formed so as to surround a region 9 including an active region between the source electrode 3s and the drain electrode 3d.

Next, a dispersion liquid of semiconductor fine particles is placed in the region 9 surrounded by the bank 4 by an ink-jet printing apparatus. Thereafter, the substrate is subjected to heat treatment in the air at 200° C. for 1 hour using a hot plate. Thus, an n-type semiconductor layer 5 (having a film thickness of 500 nm) is formed.

Next, photosensitive polyimide is applied to the semiconductor layer 5 so as to form the insulating layer 6 (having a thickness of 200 nm). Next, the insulating layer 6 is removed partially by exposure and development, so that the pixel electrode 2 corresponding to the opening 10 of FIG. 2 is exposed.

Next, a gate electrode 7 having the same thickness as that of the source electrode 3s and the drain electrode 3d is formed using the same material as that of the electrodes 3d and 3s. A part 7c of the gate electrode 7 overlaps the pixel electrode 2 in the next row across the insulating layer 6, and the overlapping portion forms an auxiliary capacitor.

The present inventors have carried out extensive studies on how to synthesize the semiconductor fine particles that constitute the semiconductor layer 5. As a result, they have found that the semiconductor fine particles can be synthesized in the following manner. An example of the method of synthesizing the semiconductor fine particles is described below. In the following description, "Ac" denotes acetate ($CH_3COO$).

In the following synthesis, zinc acetate anhydride ($Zn(Ac)_2$), indium acetate ($In(Ac)_3$), lithium hydroxide monohydrate ($LiOH \cdot H_2O$), ethanol (absolute ethanol), dodecanethiol, and hexane were used. These were all manufactured by Wako Pure Chemical Industries, Ltd. In the following synthesis, gallium acetate ($Ga(Ac)_3$) (manufactured by Great Western Inorganics Inc. (USA)) also was used.

First, under a nitrogen atmosphere, 2.5 mmol of zinc acetate, 0.5 mmol of indium acetate, and 0.5 mmol of gallium acetate were dissolved into 100 ml of ethanol. Thus, an acetate solution was prepared. This acetate solution was cooled to 0° C. 10 mmol of $LiOH \cdot H_2O$ was poured into another beaker containing 50 ml of ethanol, and was dissolved using an ultrasonic bath. The resulting lithium hydroxide solution was dropped into the acetate solution, and the dropping was stopped when the turbidity of the acetate solution disappeared and became clear. Up to this time, about half of the lithium hydroxide solution had been dropped. At this stage, fine particles composed of a complex oxide including zinc, indium and gallium were dispersed in the solution. However, after the liquid was left standing for several days, the fine particles aggregated and precipitated. Thus 5 mmol of a surfactant (dodecanethiol), which is to be adsorbed on the surface of the fine particles, was added to the liquid and stirred for 2 hours. This process prevented aggregation of fine particles.

Next, 40 ml of hexane was added to the dispersion liquid of the fine particles and stirred, and then the resulting mixture was centrifuged. Thus, only a precipitate was isolated. Next, a cycle of dispersing the precipitate in 100 ml of ethanol, adding hexane thereto, and centrifuging the resulting dispersion liquid to isolate a precipitate was performed. This cycle was repeated 10 times. Finally, the precipitate was dried in a vacuum dryer at 60° C. for 1 hour.

The composition and x-ray diffraction pattern of the obtained powder were analyzed by x-ray fluorescence spectrometry. The analysis revealed that the powder particles were $InGaO_3(ZnO)_5$ crystals (microcrystallites). When the fine particles were observed with a transmission electron microscope, the diameters of the fine particles were in the range of approximately 3 to 5 nm. When the fine particles were observed at a high magnification, the crystal lattice thereof was visible, and thus it was confirmed that the fine particles were nanocrystals. In addition, the fine particles were spaced away from each other at approximately regular intervals. It is thus conceivable that dodecanethiol was adsorbed on the surface of the fine particles.

Next, the $InGaO_3(ZnO)_5$ powder was dispersed in ethanol so as to prepare a dispersion liquid. This dispersion liquid was applied to the substrate and subjected to heat treatment at 200° C. for 1 hour. Thus, a thin film (having a thickness of 200 nm) was formed. Terminals made of gold were formed on the four sides of this thin film, and the Hall mobility thereof was measured. As a result, the thin film exhibited an n-type conductivity and the mobility thereof was approximately 8 cm$^2$/V·s. This value of mobility is close to that of an amorphous InGaO$_3$(ZnO) thin film that is disclosed in the above-mentioned document (Nature, Vol. 432, pages 488-492, November 2004). In contrast, the mobility of a nanocrystalline ZnO thin film prepared in the same manner was only about 0.2 cm$^2$/V·s. Not only ZnO nanocrystalline thin films but also any nanocrystalline thin films have more surface defects and thus have higher resistance between particles than those of a thin film formed by a vacuum method. Accordingly, the mobility of a nanocrystalline thin film usually is very small. Meanwhile, the present inventors have found that a complex oxide of ZnO and InGaO$_3$ has a higher mobility even if it is nanocrystalline.

An amorphous thin film (an InGaO$_3$(ZnO) thin film) that is formed by a vacuum film-forming method disclosed in the above-mentioned document (Nature, Vol. 432, pages 488-492, November 2004) is a continuous film in which a network of chemical bonds between constituent atoms prevails. The amorphous thin film includes no interface therein. On the other hand, a film composed of semiconductor fine particles includes interfaces between the particles. Therefore, a conventional semiconductor film (a film composed of ZnO fine particles, for example) has a very high interface resistance and thus has a low mobility. Meanwhile, the present inventors have found that a film composed of fine particles of a complex oxide including ZnO and InGaO$_3$ has a lower interface resistance between particles and accordingly an improved mobility. As described above, the present invention differs in the film structure from the invention (the invention for improving the mobility in an amorphous material) described in the above-mentioned document (Nature, Vol. 432, pages 488-492, November 2004), and therefore also differs in the activity of InGaO$_3$.

Figure 3:
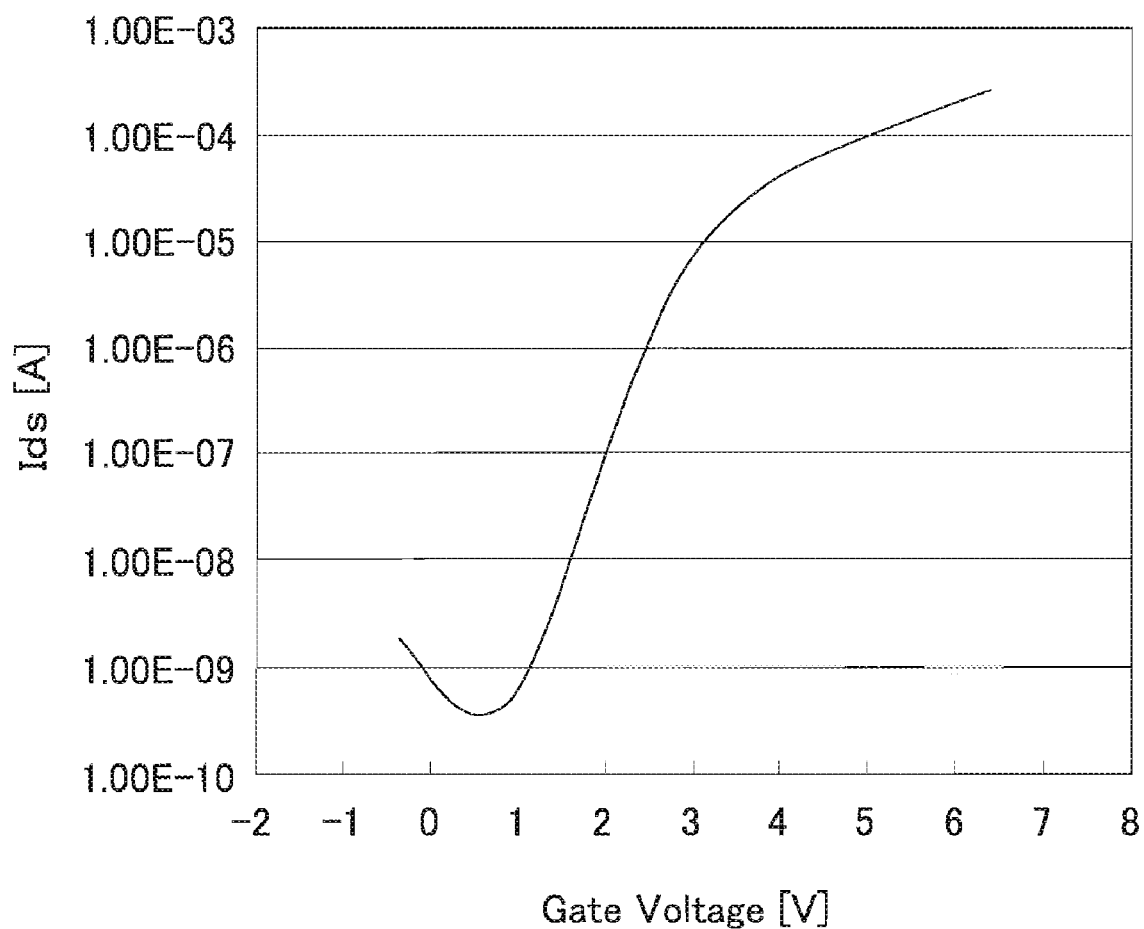
FIG. 3 shows the performance of the example of the thin film transistor according to the present invention.

A TFT having a structure as shown in FIGS. 1 and 2 was fabricated by the above-mentioned method using an ethanol dispersion of InGaO$_3$(ZnO)$_5$. The performance of the TFT thus fabricated was measured. Specifically, the current value Ids that flows between the source and the drain was measured with a fixed source-drain voltage of 3 volts while varying a gate voltage by using a semiconductor parameter analyzer. FIG. 3 shows the results of the measurement. In FIG. 3, the horizontal axis shows the gate voltage Vg and the vertical axis shows the source-drain current Ids.

The gate voltage Vg started to increase on reaching approximately 0.8 volts. The on/off ratio exceeded 10$^5$ when the gate voltage Vg was 5 volts. Thus, the performance of the TFT was high enough to drive liquid crystal and organic EL panels.

Figure 4:
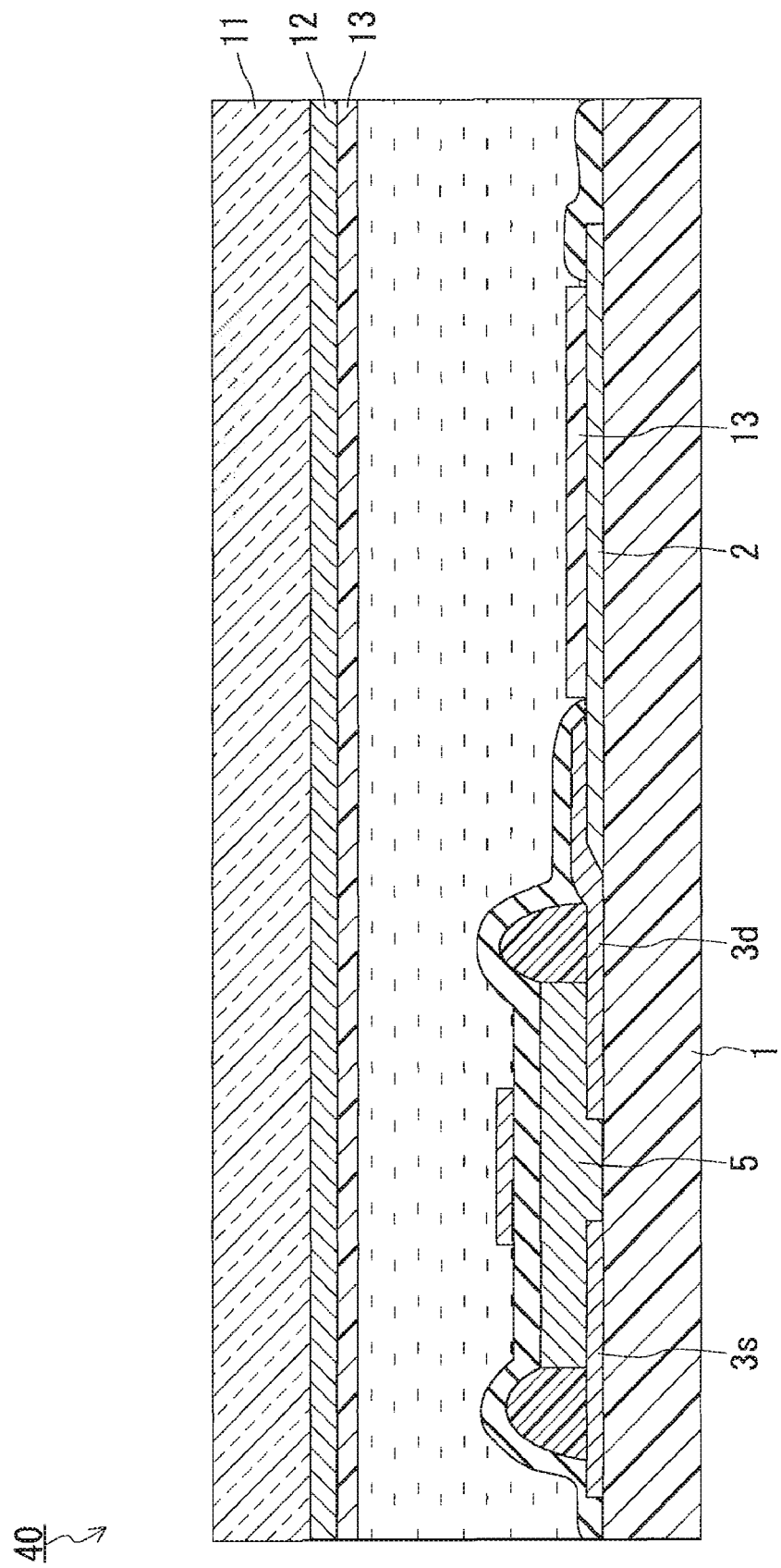
FIG. 4 shows a cross section of an example of a liquid crystal panel according to the present invention.

FIG. 4 shows a cross section of an example of a liquid crystal panel using the TFT of FIG. 2. A liquid crystal panel 40 of FIG. 4 was fabricated by a commonly-used method. First, a common electrode 12 made of ITO was formed on an opposite substrate 11. Next, oriented films 13 made of polyimide were formed on the common electrode 12 and the pixel electrode 2 by a printing process. Next, after both of the two substrates were rubbed and a spacer was sprayed thereon, they were bonded to each other. Next, a liquid crystal 14 was introduced between the two substrates and was TN-oriented. Thus, the liquid crystal panel was fabricated. When this liquid crystal panel was driven by a commonly-used method, the contrast thereof was 100 or more and the transmittance thereof was 20% or more. Thus, the liquid crystal panel 40 showed good performance.

Next, the proportion of ZnO to the total amount of semiconductor fine particle materials was decreased so as to obtain fine particles having a composition represented by the formula InGaO$_3$(ZnO)$_m$ (m is a natural number of 4 or less). When m was a natural number of 4 or less, the fine particles were amorphous fine particles but there was not much difference in their performance as compared to that when m was 5. When m was greater than 5, the fine particles were single crystals, and their mobility decreased as the value of m increased. Accordingly, it is preferable that m is 10 or less in order to drive a display element. It should be noted that m in a complex compound InGaO$_3$(ZnO)$_m$ usually is a natural number. However, when a product is analyzed with X-rays or the like, the value of m calculated based on the measurement results may of course differ slightly from a natural number due to measuring errors, influences of impurities, crystal defects and the like.

According to the above-mentioned document (Thin Solid Films, Vol. 445, pages 322-326, 2003), single crystalline InGaO$_3$(ZnO)$_m$ films (m is greater than 5) are fabricated by epitaxial growth, which is not suitable for larger-sized displays. In contrast, the present invention makes it possible to form a semiconductor layer by applying semiconductor fine particles using a low-cost printing method such as an ink-jet method. Accordingly, the present invention can realize a larger display.

It is preferable that organic molecules are adsorbed on the surface of the semiconductor fine particles or the surface of the semiconductor fine particles is hydrogenated. By doing so, it is possible to prevent the aggregation of the semiconductor fine particles in the dispersion liquid and to enhance the mobility of the semiconductor layer. It should be noted, however, that the mobility decreased significantly when the heat treatment of the applied semiconductor fine particles was carried out at a temperature lower than 150° C. A semiconductor layer that has been subjected to heat treatment at a higher temperature is higher in performance. It is preferable that the heat treatment is carried out at a temperature of 150° C. or higher (200° C. or higher, for example) but at a temperature equal to or lower than the heat resistance temperature of a substrate. When the semiconductor layer was subjected to heat treatment at a temperature of 150° C. or higher and the cross section thereof was observed with an electron microscope, there was almost no space between fine particles in the center of the semiconductor layer. On the other hand, on the surface of the semiconductor layer, the fine particles were spaced far away from each other and organic molecules remained therein. Thus it is conceivable that when the semiconductor layer is subjected to heat treatment at 150° C., the organic molecules do not evaporate but move through the spaces between the fine particles, thereby enhancing the mobility of the semiconductor layer.

Besides the InGaO$_3$(ZnO)$_5$ particles, the synthesis of p-type ZnO.Rh$_2$O$_3$ semiconductor fine particles was studied. As a result, the p-type ZnO.Rh$_2$O$_3$ semiconductor fine particles could be synthesized in the following manner.

In the following synthesis, zinc acetate anhydride (Zn (Ac)$_2$), rhodium acetate dimer (Rh(Ac)$_2$), lithium hydroxide monohydrate (LiOH.H$_2$O), ethanol (absolute ethanol), dodecanethiol, and hexane were used. These were all manufactured by Wako Pure Chemical Industries, Ltd.

First, under a nitrogen atmosphere, 1 mmol of zinc acetate and 2 mmol of rhodium acetate were dissolved into 100 ml of boiling ethanol. Thus, an acetate solution was prepared. This acetate solution was cooled to 0° C. 10 mmol of LiOH H$_2$O was poured into another beaker containing 50 ml of ethanol, and was dissolved using an ultrasonic bath. The resulting LiOH solution was dropped into the acetate solution while stirring it, and the dropping was stopped when the turbidity of the acetate solution disappeared and became clear. Up to this time, about half of the LiOH solution had been dropped. At this stage, fine particles of a complex oxide including zinc and rhodium were dispersed in the liquid. However, after the liquid was left standing for several days, the fine particles aggregated and precipitated. Thus 5 mmol of a surfactant (dodecanethiol), which is to be adsorbed on the surface of the fine particles, was added to the liquid and stirred for 2 hours. This process prevented the aggregation of fine particles.

Next, 40 ml of hexane was added to the dispersion liquid of the fine particles and stirred, and then the resulting mixture was centrifuged. Thus, only a precipitate was isolated. In this process, unnecessary components such as lithium acetate, water and dodecanethiol were removed from the liquid. Next, a cycle of dispersing the precipitate in 100 ml of ethanol, adding hexane thereto, and centrifuging the resulting dispersion liquid to isolate a precipitate was performed. This cycle was repeated 10 times. Finally, the precipitate was dried in a vacuum dryer at 60° C. for 1 hour.

The composition and x-ray diffraction pattern of the obtained powder were analyzed by x-ray fluorescence spectrometry. The analysis revealed that the powder particles were $ZnRh_2O_4$ (i.e., $ZnO.Rh_2O_3$) microcrystallites. When the fine particles were observed with a transmission electron microscope, the diameters of the fine particles were in the range of approximately 2 to 5 nm. When the fine particles were observed at a high magnification, the crystal lattice was visible, and thus it was confirmed that the fine particles were single crystalline fine particles. In addition, the fine particles were spaced away from each other at approximately regular intervals. It is thus conceivable that dodecanethiol was adsorbed on the surface of the fine particles.

Next, a thin film was formed on the substrate using an ethanol dispersion of $ZnRh_2O_4$ fine particles. Then, electrodes made of gold were formed on the four sides of this thin film, and the Hall effect thereof was measured. As a result, the thin film exhibited a p-type conductivity and the mobility thereof was approximately 0.3 $cm^2/V·s$. The TFT 10 as shown in FIGS. 1 and 2 was fabricated in the same manner as the fine particles of $InGaO_3(ZnO)_5$. The TFT 10 had an on/off ratio of $10^4$. Thus, the TFT showed relatively good performance.

When the diameter of semiconductor fine particles is too large, the space between the fine particles increases, which thereby reduces the conductivity. Therefore, the diameter of the semiconductor fine particles preferably is 50 nm or less, and more preferably 20 nm or less. On the other hand, when the diameter of the semiconductor fine particles is less than 1 nm, the length of organic molecules is greater than the particle diameter, which causes difficulty in removing the surface defects. Therefore, it is preferable that the diameter of the semiconductor fine particles is 1 nm or more.

As an example of the display element of the present invention, a liquid crystal panel has been described with reference to FIG. 4. The electronic device of the present invention may, however, be an organic EL display device, an inorganic EL display device, or the like. By driving a light-receiving or light-emitting type light modulation layer by the TFT of the present invention, it is possible to realize an inexpensive, thin, and lightweight display element.

The present invention makes it possible to form a semiconductor layer with a higher mobility and a larger area than conventional ones at low cost by a printing method. Moreover, the semiconductor layer can be formed on a plastic substrate by a low-temperature process. Accordingly, the present invention makes it possible to manufacture a thin and lightweight display element using a film substrate at low cost. The use of the TFT of the present invention also makes it possible to form an electronic circuit such as an RF tag on a plastic substrate. Accordingly, the present invention also can be used for flexible mobile terminals.

The present invention may be embodied in other specific forms without departing the spirit and the essential features thereof. The embodiments disclosed in this description are given for illustrative purpose in all respects, and the present invention is not limited thereto. The scope of the present invention is set forth not by the foregoing description but by the scope of the claims attached hereto, and is intended to cover all the modifications within a spirit and scope equivalent to those of the claims.

INDUSTRIAL APPLICABILITY

The present invention can be applied to a thin film transistor. The present invention also can be applied to an electronic device such as a display element and a mobile terminal.

The invention claimed is:

1. A thin film transistor comprising: a semiconductor layer; a source electrode and a drain electrode that each are connected to the semiconductor layer; an insulating layer that is formed adjacent to the semiconductor layer; and a gate electrode that faces the semiconductor layer across the insulating layer,
   wherein the semiconductor layer includes an aggregate of semiconductor fine particles composed of a complex oxide, and
   the complex oxide contains zinc and at least one selected from a group consisting of indium, gallium, and rhodium.

2. The thin film transistor according to claim 1, wherein the complex oxide has a composition represented by $InGao_3(ZnO)_m$ (m is a natural number of 10 or less), or $ZnO.Rh_2O_3$.

3. The thin film transistor according to claim 1, wherein the semiconductor fine particles each are composed of a crystal of the complex oxide.

4. The thin film transistor according to claim 1, wherein the semiconductor fine particles have an average particle diameter of not greater than 50 nm.

5. The thin film transistor according to claim 1, wherein a surfactant is adsorbed on the surface of the semiconductor fine particles.

6. A method of manufacturing a thin film transistor including a semiconductor layer, the method comprising the steps of:
   (i) forming a layer including an aggregate of semiconductor fine particles composed of a complex oxide by using a liquid that contains the semiconductor fine particles composed of the complex oxide; and
   (ii) forming the semiconductor layer by subjecting the layer including the aggregate of the semiconductor fine particles to a heat treatment at a temperature of 150° C. or higher,
   wherein the complex oxide contains zinc and at least one selected from a group consisting of indium, gallium, and rhodium.

7. The manufacturing method according to claim 6, wherein the liquid contains a surfactant.

8. An electronic device comprising an electronic circuit, wherein the electronic circuit includes the thin film transistor according to claim 1.

9. The electronic device according to claim 8, wherein the electronic device is a display device.

10. The electronic device according to claim 8, wherein the electronic device is a mobile terminal.

11. The thin film transistor according to claim 1, wherein the complex oxide has a composition represented by $ZnO \cdot Rh_2O_3$.

12. The manufacturing method according to claim 6, wherein the complex oxide has a composition represented by $InGaO_3(ZnO)m$ (m is a natural number of 10 or less), or $ZnO \cdot Rh_2O_3$.

13. The manufacturing method according to claim 6, wherein the complex oxide has a composition represented by $ZnO \cdot Rh_2O_3$.

* * * * *

UNITED STATES PATENT AND TRADEMARK OFFICE
CERTIFICATE OF CORRECTION

PATENT NO. : 8,013,331 B2
APPLICATION NO. : 12/305101
DATED : September 6, 2011
INVENTOR(S) : Wakita It is certified that error appears in the above-identified patent and that said Letters Patent is hereby corrected as shown below:

Column 1, lines 40 and 44: "$InGaO_3.ZnO$" should be -- $InGaO_3 \bullet ZnO$ --.
Column 3, line 45: "$ZnO.Rh_2O_3$" should be -- $ZnO \bullet Rh_2O_3$ --.
Column 6, lines 16 and 25: "$LiOH.H_2O$" should be -- $LiOH \bullet H_2O$ --.
Column 8, lines 51 and 52: "$ZnO.Rh_2O_3$" should be --- $ZnO \bullet Rh_2O_3$ --.
Column 8, line 56: "$LiOH.H_2O$" sould be -- $LiOH \bullet H_2O$ --.
Column 8, line 62: "$LiOH.H_2O$" sould be -- $LiOH \bullet H_2O$ --.
Column 9, line 22: "$ZnO.Rh_2O_3$" should be -- $ZnO \bullet Rh_2O_3$ --.
Column 10, line 34 (claim 2): "$InGao_3.(ZnO)_m$" should be -- $InGaO_3 \bullet (ZnO)_m$ --.
Column 10, line 35 (claim 2): "$ZnO.Rh_2O_3$" should be -- $ZnO \bullet Rh_2O_3$ --.
Column 11, line 3 (claim 11): "$ZnO.Rh_2O_3$" should be -- $ZnO \bullet Rh_2O_3$ --.
Column 11, line 6 (claim 12): "$InGa0_3.(ZnO)m$" should be -- $InGaO_3 \bullet (ZnO)_m$ --.
Column 11, line 7 (claim 12): "$ZnO.Rh_2O_3$" should be -- $ZnO \bullet Rh_2O_3$ --.
Column 12, line 3 (claim 13): "$ZnO.Rh_2O_3$" should be -- $ZnO \bullet Rh_2O_3$ --.

Signed and Sealed this
Nineteenth Day of June, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,013,331 B2 | Page 1 of 1 |
| APPLICATION NO. | : 12/305101 | |
| DATED | : September 6, 2011 | |
| INVENTOR(S) | : Wakita | |

It is certified that error appears in the above-identified patent and that said Letters Patent is hereby corrected as shown below:

Column 1, lines 40 and 44: "$InGaO_3.ZnO$" should be -- $InGaO_3 \bullet ZnO$ --.
Column 3, line 45: "$ZnO.Rh_2O_3$" should be -- $ZnO \bullet Rh_2O_3$ --.
Column 6, lines 16 and 25: "$LiOH.H_2O$" should be -- $LiOH \bullet H_2O$ --.
Column 8, lines 51 and 52: "$ZnO.Rh_2O_3$" should be --- $ZnO \bullet Rh_2O_3$ --.
Column 8, line 56: "$LiOH.H_2O$" should be -- $LiOH \bullet H_2O$ --.
Column 8, line 62: "$LiOH.H_2O$" should be -- $LiOH \bullet H_2O$ --.
Column 9, line 22: "$ZnO.Rh_2O_3$" should be -- $ZnO \bullet Rh_2O_3$ --.
Column 10, line 34 (claim 2): "$InGao_3.(ZnO)_m$" should be -- $InGaO_3 \bullet (ZnO)_m$ --.
Column 10, line 35 (claim 2): "$ZnO.Rh_2O_3$" should be -- $ZnO \bullet Rh_2O_3$ --.
Column 11, line 3 (claim 11): "$ZnO.Rh_2O_3$" should be -- $ZnO \bullet Rh_2O_3$ --.
Column 11, line 6 (claim 12): "$InGa0_3.(ZnO)m$" should be -- $InGaO_3 \bullet (ZnO)_m$ --.
Column 11, line 7 (claim 12): "$ZnO.Rh_2O_3$" should be -- $ZnO \bullet Rh_2O_3$ --.
Column 12, line 3 (claim 13): "$ZnO.Rh_2O_3$" should be -- $ZnO \bullet Rh_2O_3$ --.

This certificate supersedes the Certificate of Correction issued June 19, 2012.

Signed and Sealed this
Twentieth Day of November, 2012

David J. Kappos
*Director of the United States Patent and Trademark Office*

UNITED STATES PATENT AND TRADEMARK OFFICE
CERTIFICATE OF CORRECTION

PATENT NO. : 8,013,331 B2
APPLICATION NO. : 12/305101
DATED : September 6, 2011
INVENTOR(S) : Wakita It is certified that error appears in the above-identified patent and that said Letters Patent is hereby corrected as shown below:

Column 1, lines 40 and 44: "$InGaO_3.ZnO$" should be -- $InGaO_3 \bullet ZnO$ --.
Column 3, line 45: "$ZnO.Rh_2O_3$" should be -- $ZnO \bullet Rh_2O_3$ --.
Column 6, lines 16 and 25: "$LiOH.H_2O$" should be -- $LiOH \bullet H_2O$ --.
Column 8, lines 51 and 52: "$ZnO.Rh_2O_3$" should be -- $ZnO \bullet Rh_2O_3$ --.
Column 8, line 56: "$LiOH.H_2O$" should be -- $LiOH \bullet H_2O$ --.
Column 8, line 62: "$LiOH.H_2O$" should be -- $LiOH \bullet H_2O$ --.
Column 9, line 22: "$ZnO.Rh_2O_3$" should be -- $ZnO \bullet Rh_2O_3$ --.
Column 10, line 34 (claim 2): "$InGao_3.(ZnO)_m$" should be -- $InGaO_3(ZnO)_m$ --.
Column 10, line 35 (claim 2): "$ZnO.Rh_2O_3$" should be -- $ZnO \bullet Rh_2O_3$ --.
Column 11, line 3 (claim 11): "$ZnO.Rh_2O_3$" should be -- $ZnO \bullet Rh_2O_3$ --.
Column 11, line 6 (claim 12): "$InGa0_3.(ZnO)m$" should be -- $InGaO_3(ZnO)_m$ --.
Column 11, line 7 (claim 12): "$ZnO.Rh_2O_3$" should be -- $ZnO \bullet Rh_2O_3$ --.
Column 12, line 3 (claim 13): "$ZnO.Rh_2O_3$" should be -- $ZnO \bullet Rh_2O_3$ --.

This certificate supersedes the Certificates of Correction issued June 19, 2012 and November 20, 2012.

Signed and Sealed this
Twenty-sixth Day of March, 2013

Teresa Stanek Rea
*Acting Director of the United States Patent and Trademark Office*